United States Patent
Lopez et al.

(10) Patent No.: US 7,353,431 B2
(45) Date of Patent: Apr. 1, 2008

(54) METHOD AND APPARATUS FOR PROACTIVE FAULT MONITORING IN INTERCONNECTS

(75) Inventors: Leoncio D. Lopez, Escondido, CA (US); David K. McElfresh, San Diego, CA (US); Dan Vacar, San Diego, CA (US); Kenny C. Gross, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/508,025

(22) Filed: Aug. 21, 2006

(65) Prior Publication Data
US 2006/0282705 A1 Dec. 14, 2006

(51) Int. Cl.
*G06F 11/00* (2006.01)
(52) U.S. Cl. .......................... 714/47; 714/48
(58) Field of Classification Search ............ 714/37–39, 714/47, 43–44, 56
See application file for complete search history.

(56) References Cited

U.S. PATENT DOCUMENTS

| | | | | |
|---|---|---|---|---|
| 5,668,944 A | * | 9/1997 | Berry | 714/47 |
| 5,680,541 A | * | 10/1997 | Kurosu et al. | 714/26 |
| 6,594,784 B1 | * | 7/2003 | Harper et al. | 714/47 |
| 6,629,266 B1 | * | 9/2003 | Harper et al. | 714/38 |
| 7,006,947 B2 | * | 2/2006 | Tryon et al. | 702/183 |
| 7,020,595 B1 | * | 3/2006 | Adibhatla et al. | 703/7 |
| 7,076,695 B2 | * | 7/2006 | McGee et al. | 714/47 |
| 2002/0133757 A1 | * | 9/2002 | Bertram et al. | 714/47 |
| 2002/0174384 A1 | * | 11/2002 | Graichen et al. | 714/37 |
| 2003/0065986 A1 | * | 4/2003 | Fraenkel et al. | 714/47 |
| 2003/0070120 A1 | * | 4/2003 | Michael et al. | 714/38 |

* cited by examiner

*Primary Examiner*—Dieu-Minh Le
(74) *Attorney, Agent, or Firm*—Park, Vaughan & Fleming LLP; Gilbert Wong (57) ABSTRACT

A system that detects the onset of degradation for interconnections in a component within a computer system. During operation, the system monitors inferential variables associated with the interconnections during operation of the computer system. Next, the system determines a present state of the component from the monitored inferential variables. The system then compares the present state of the component with an initial state of the component. If the comparison indicates that the interconnections in the component have reached or will reach a limited operating state (LOS), the system performs a remedial action.

18 Claims, 5 Drawing Sheets

METHOD AND APPARATUS FOR PROACTIVE FAULT MONITORING IN INTERCONNECTS

RELATED APPLICATION

This application is related to a pending U.S. patent application, entitled "Detecting and Correcting a Failure Sequence in a Computer System Before a Failure Occurs," by inventors Kenny C. Gross, Lawrence G. Votta, Jr. and Adam Porter, having serial number 10/777,532 and a filing date of 11 Feb. 2004. Moreover, the above-listed application is hereby incorporated by reference.

BACKGROUND

1. Field of the Invention

The present invention relates to techniques for detecting degradation of components within a computer system. More specifically, the present invention relates to a method and apparatus for detecting the onset of degradation and for estimating the remaining useful life of interconnects within a computer system.

2. Related Art

An increasing number of businesses are using computer systems for mission-critical applications. In such applications, a component failure can have a devastating effect on the business. For example, the airline industry is critically dependent on computer systems that manage flight reservations, and would essentially cease to function if these systems failed. Hence, it is critically important to measure component reliabilities to ensure that they meet or exceed the reliability requirements of the computer system.

Unfortunately, determining the reliability of interconnects in high-end computer systems is a challenging task. Interconnects which are commonly found in memory modules, surface mount components, and integrated-circuit (IC) component sockets, are typically very high in density, which means there often exists hundreds to thousands of interconnects in a given component. When interconnects degrade or fail during the lifetime of the computer system, the failure can be difficult to troubleshoot and to isolate. Moreover, correcting issues related to interconnect failures can result in long equipment down times, which can severely impact the end user.

One solution to this problem is to monitor the computer system for interconnect faults. Unfortunately, present monitoring and surveillance techniques for interconnects are "reactive" in nature, providing a warning or actuating an alarm only after an interconnect failure has occurred. Presently, there are no techniques that allow "proactive" fault monitoring (i.e., providing an early warning of degradation) for interconnects within a computer system during operation of the computer system.

Hence, what is needed is a method and an apparatus for detecting the onset of degradation and for estimating the remaining useful life of interconnects within a computer system without the problems described above.

SUMMARY

One embodiment of the present invention provides a system that detects the onset of degradation for interconnections in a component within a computer system. During operation, the system monitors inferential variables associated with the interconnections during operation of the computer system. Next, the system determines a present state of the component from the monitored inferential variables. The system then compares the present state of the component with an initial state of the component. If the comparison indicates that the interconnections in the component have reached or will reach a limited operating state (LOS), the system performs a remedial action. Note that the LOS is defined as an amount of degradation that the interconnections in the component have incurred since the initial state which makes further operation of the component unacceptable.

In a variation on this embodiment, while performing the remedial action, the system services or replaces the component.

In a variation on this embodiment, while determining if the interconnections in the component have reached or will reach the LOS, the system determines an operational trend for the state of the component based on data gathered during the monitoring process. The system then uses the operational trend to determine whether the interconnection in the component will reach the LOS.

In a variation on this embodiment, prior to monitoring the inferential variables, the system determines the initial state of the component by: (1) monitoring the inferential variables during an initial period of normal operation, and (2) determining the initial state from the monitored inferential variables.

In a variation on this embodiment, the LOS is a state wherein the amount of degradation that has occurred since the initial state makes further operation of the component unacceptable.

In a variation on this embodiment, the initial state of the component is defined as 100% remaining life, and the LOS of the component is defined as 0% remaining life.

In a further variation, the system calculates a remaining life for the component by: (1) calculating an amount of degradation which has occurred in the interconnections in the component since the initial state, and (2) normalizing the amount of degradation (to a range between the initial state and the LOS) to generate an estimate for the remaining life of the component.

In a further variation, the system calculates a remaining life for the component by using a model of a degradation mechanism for the interconnections.

In a variation on this embodiment, the inferential variables can include voltage, current resistance, capacitance, inductance, and indicators of signal integrity, including, but not limited to a signal/noise ratio, a bit-error rate, the number of times an operation in the component is retried, and the size of an eye-diagram opening.

In a variation on this embodiment, a state of an inferential variable can include a present value of the inferential variable, a mean of the inferential variable, a variance of the inferential variable, a skewness of the inferential variable, a kurtosis of the inferential variable, and a derivative of the inferential variable.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, flash memory, CDs (compact discs) and DVDs (digital versatile discs or digital video discs).

Detecting the Onset of Degradation for Interconnects

By monitoring system telemetry for a given network of interconnects, proactive warnings for the onset of degradation in the interconnects can be obtained. Hence, one embodiment of the present invention uses continuous system telemetry and Sequential Probability Ratio Tests (SPRTs), to monitor interconnects for components within a computer system to detect the onset of degradation in the interconnects. Note that SPRTs are discussed in more detail below. Also note that although the present specification discusses electrical interconnects, the present invention can be applied to many types of interconnects including, but not limited to: electrical interconnects, optical interconnects, magnetic interconnects, capacitive interconnects, inductive interconnects, electromagnetic interconnects, and other interconnects presently known or later developed.

Figure 1A:
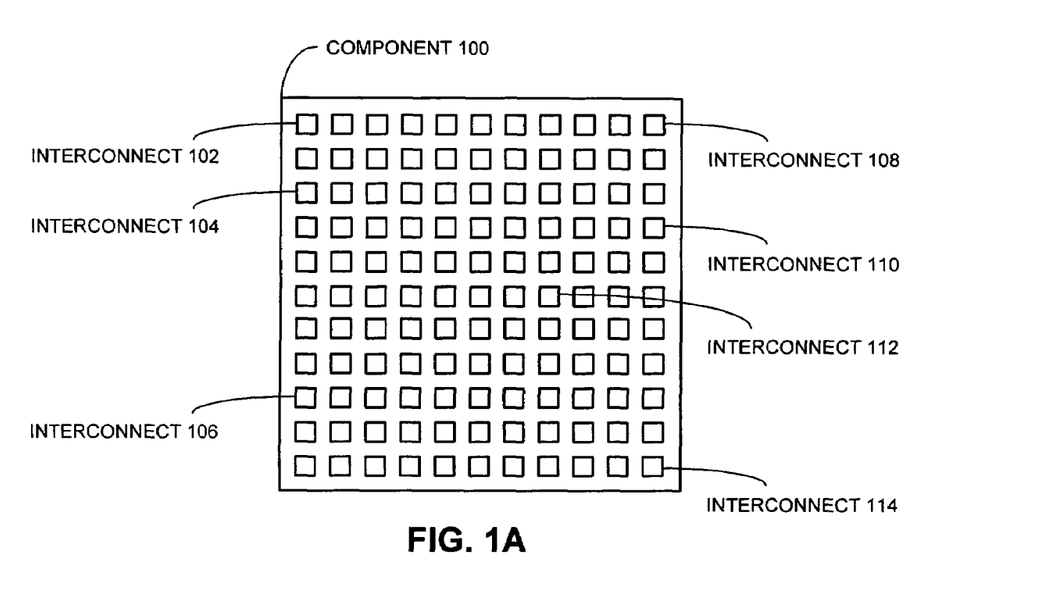
FIG. 1A presents a block diagram of a component with interconnects in accordance with an embodiment of the present invention.

FIG. 1A presents a block diagram of component 100 with interconnects in accordance with an embodiment of the present invention. A number of interconnects 102-114 from component 100 are selected for continuous monitoring.

Figure 1B:
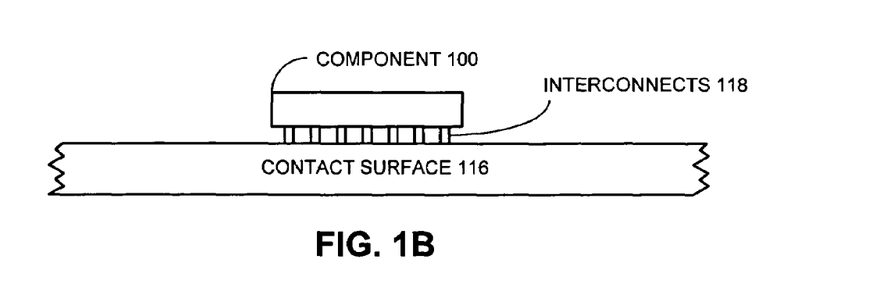
FIG. 1B presents a block diagram of a component coupled to a contact surface with interconnects in accordance with an embodiment of the present invention.

FIG. 1B presents a block diagram of component 100 coupled to contact surface 116 with interconnects 118 in accordance with an embodiment of the present invention. Note that although 5 interconnects are illustrated in FIG. 1B, the number of interconnects for component 100 can be more or less depending on the application. In one embodiment of the present invention, contact surface 116 is a printed circuit board (PCB).

In one embodiment of the present invention, the technique for mounting component 100 to contact surface 116 can include, but is not limited to: soldered or socketed ball grid arrays (BGA), soldered or socketed land grid arrays (LGA), soldered or socketed pin grid arrays (PGAs), single and dual in-line memory module (SIMM and DIMM) sockets, soldered or socketed single in-line packages (SIPs), soldered or socketed dual in-line packages (DIPs), surface mounts, through hole mounts, mechanical mounts, and other component mounting techniques now known or later developed. Also note that the PCB can be one of many PCBs within a computer system.

Figure 2:
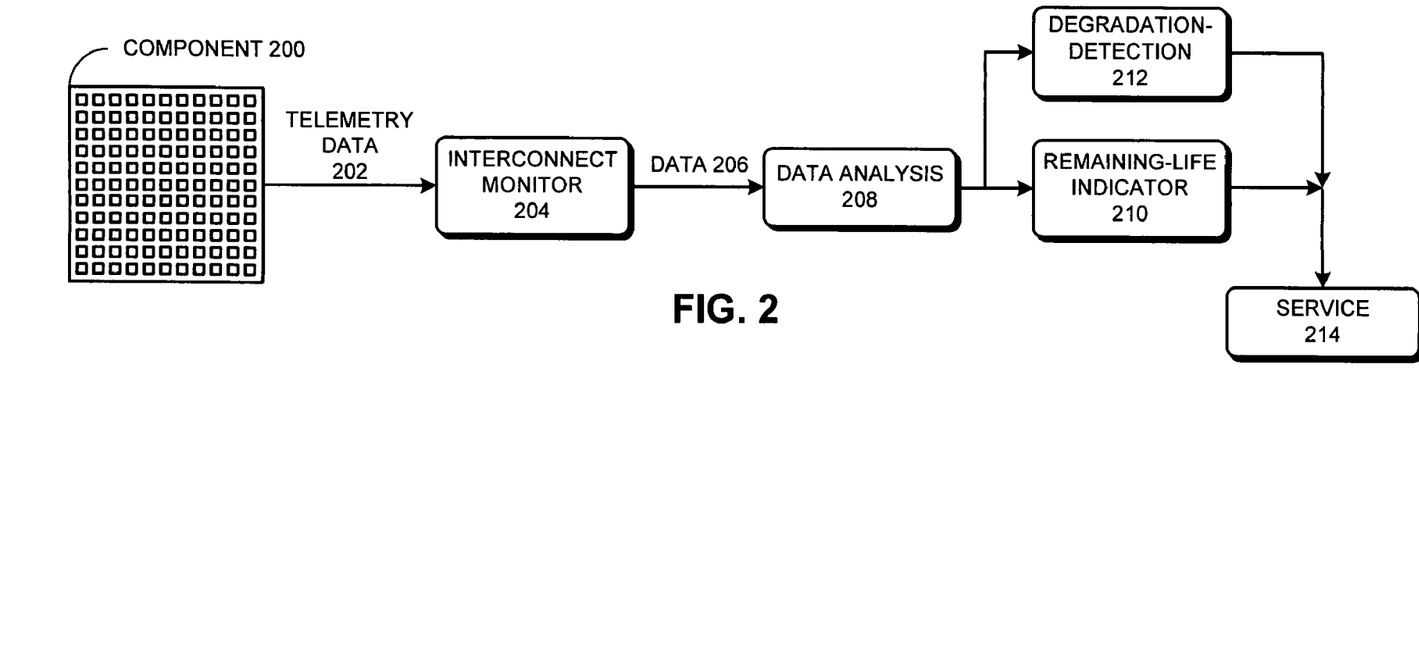
FIG. 2 presents a block diagram of a system that estimates the remaining life of interconnects for a component within a computer system in accordance with an embodiment of the present invention.

One embodiment of the present invention estimates the remaining life of a component within a computer system. More specifically, FIG. 2 presents a block diagram of a system that estimates the remaining life of interconnects for a component within a computer system in accordance with an embodiment of the present invention. Telemetry data 202, collected from component 200, is processed by interconnect monitor module 204. Interconnect monitor module 204 provides data 206, which includes inferential variables associated with interconnects within component 200, to data analysis module 208 for analysis. The remaining life is then calculated by remaining-life indicator module 210. In this embodiment, an initial operating state is defined as 100% "Life Remaining" and a Limited Operating State (LOS) is defined as 0% Life Remaining. Degradation-detection module 212 determines when a component is at the onset of degradation or has degraded. Service module 214 services or replaces component 200.

In one embodiment of the present invention, the LOS is defined as an amount of degradation that the interconnections in the component have incurred since the initial state which makes further operation of the component unacceptable. In one embodiment of the present invention, the LOS is determined based on a percentage degradation from the initial operating state for the monitored telemetry metrics. For example, the LOS can be defined as a 20% degradation from the initial resistance and from an initial indicator of signal integrity.

One embodiment of the present invention monitors the component during normal operation of the computer system and determines an initial operating state. In one embodiment of the present invention, the initial operating state is determined during an initial period of normal operation. For example, the initial operating state can be defined as the operating state during the first few hours of normal operation of the computer system. Note that since end users have different needs, normal operation for one end user may not be the same as normal operation for another end user. For example, a computer system for an end user that runs scientific applications has a different load profile during normal operation than computer system for an end user that runs a web server.

Figure 3:
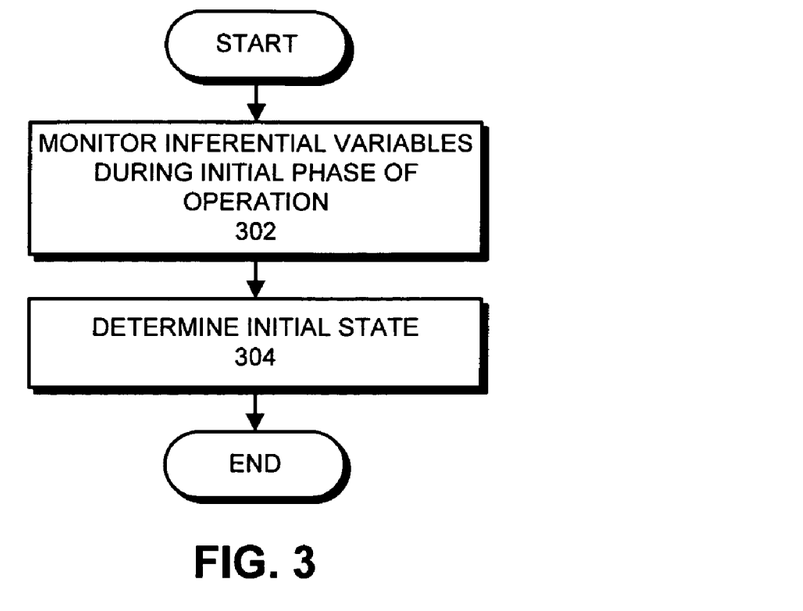
FIG. 3 presents a flowchart illustrating the process of determining an initial state of a component in accordance with an embodiment of the present invention.

FIG. 3 presents a flowchart illustrating the process of determining an initial state of a component in accordance with an embodiment of the present invention. The process begins when the system monitors inferential variables during an initial period of normal operation (step 302). The system then determines the initial state from the monitored inferential variables (step 304).

In one embodiment of the present invention, the initial operating state is determined during a training period, wherein the computer system operates under specified conditions. For example, during the training period, the computer system can execute a specified set of applications to generate a specific load profile in the computer system. Furthermore, the computer system can operate under specified physical conditions, including, but not limited to, specified: temperatures, voltages, current, humidity, pressure, electromagnetic interference, and magnetic flux.

In one embodiment of the present invention, the operating states are based on the monitored telemetry metrics including, but not limited to: voltage, current, electrical resistance, inductance, indicators of signal integrity (e.g., signal-to-noise ratio, bit error rate, the number of times an operation in the component is retried, and the size of an eye diagram opening), capacitance, and other system metrics. In one embodiment of the present invention, the operating states include statistical distribution parameters for the monitored telemetry metrics, including but not limited to: the mean, the variance, the skewness, and the kurtosis, and derivatives of the inferential variables. Note that the derivatives of the inferential variables can include time derivatives of various orders.

In one embodiment of the present invention, the remaining lifetime for the component is calculated by using a model of a degradation mechanism for the interconnections. In one embodiment of the present invention, the model includes, but is not limited to, a linear model, a super-linear model, a sub-linear model, and an exponential model.

Figure 4:
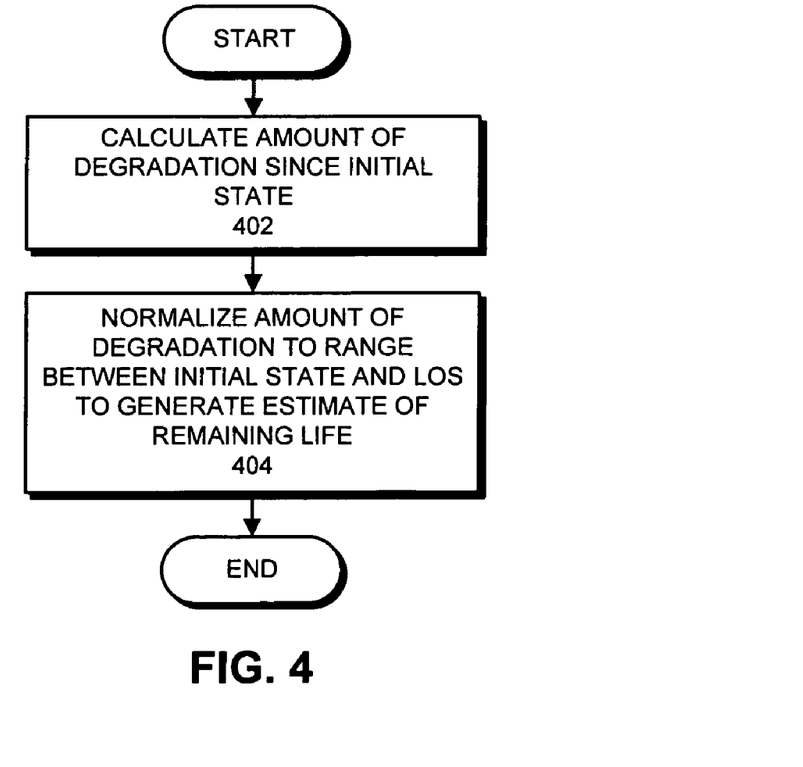
FIG. 4 presents a flowchart illustrating the process of determining the remaining life of a component using a linear model in accordance with an embodiment of the present invention.

FIG. 4 presents a flowchart illustrating the process of determining the remaining life of a component using a linear model in accordance with an embodiment of the present invention. The process begins when the system calculates an amount of degradation which has occurred in the component since the initial state (step 402). The system then normalizes the amount of degradation to a range between the initial state and the LOS to generate an estimate for the remaining life of the component (step 404).

In one embodiment of the present invention, the remaining lifetime of the component is estimated using operational trends and observations noted during normal operation of the computer system.

One embodiment of the present invention monitors a present operating state and compares it to an initial operating state. The present operating state is compared to the LOS to determine whether the present state has reached or has exceeded the LOS. If so, a warning is generated before a failure occurs. Using this information, the computer system can be repaired or serviced so that minimal disruptions occur. Note that existing techniques for interconnect fault monitoring do not provide proactive fault monitoring for interconnects within a computer system during normal operation and cannot estimate the remaining life of a component.

Figure 5:
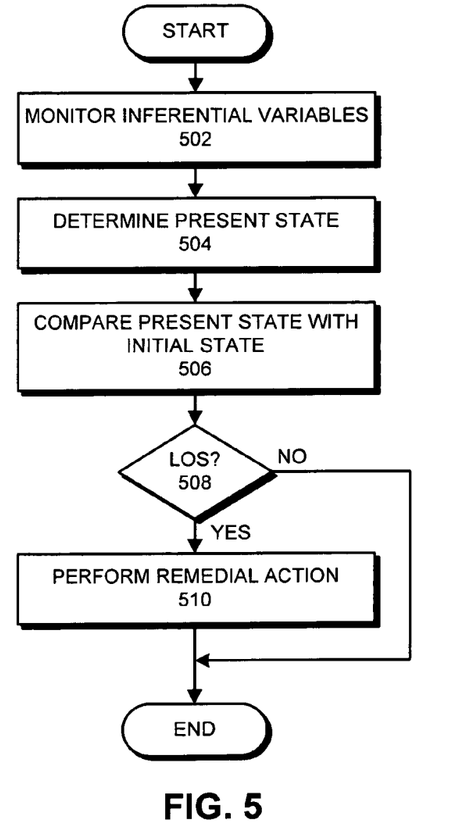
FIG. 5 presents a flowchart illustrating the process of evaluating the state of interconnects in a component within a computer system in accordance with an embodiment of the present invention.

FIG. 5 presents a flowchart illustrating the process of evaluating the state of interconnects in a component within a computer system in accordance with an embodiment of the present invention. The process begins when the system monitors inferential variables associated with the interconnections within the computer system during operation of the computer system (step 502). Next, the system determines a present state of the component from the monitored inferential variables (step 504). The system then compares the present state of the component with an initial state of the component (step 506). If the comparison indicates that the interconnections in the component have reached or will reach a limited operating state (LOS) (step 508), the system performs a remedial action (step 510).

In one embodiment of the present invention, performing the remedial action involves servicing or replacing the component. In another embodiment of the present invention, performing the remedial action involves issuing a warning.

In one embodiment of the present invention, the system estimates the remaining life of the component and uses the remaining life to schedule a time to service the component. For example, if the remaining life for a component is 90%, the component does not need to be serviced, but, if the remaining life for a component is 1%, the component should be serviced immediately.

In one embodiment of the present invention, the system uses operational trends and the estimate of the remaining life of the component to schedule a time to service the component. For example, if the remaining life for a component is 50%, but the operational trend indicates that the rate of degradation is occurring at a rate such that the component will fail within a day, the component should be serviced immediately. In contrast, if the remaining life for a component is 50%, but the operational trend indicates that the rate of degradation is occurring at a rate such that the component will fail in one year, the component does not need to be serviced immediately.

Figure 6:
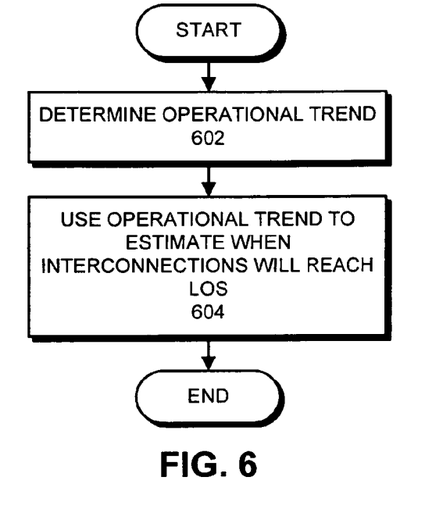
FIG. 6 presents a flowchart illustrating the process of estimating when a component will reach a limited operating state (LOS) in accordance with an embodiment of the present invention.

One embodiment of the present invention determines whether a component will reach a LOS by observing operational trends of the computer system. More specifically, FIG. 6 presents a flowchart illustrating the process of estimating when a component will reach a limited operating state in accordance with an embodiment of the present invention. During operation, the system determines an operational trend for the state of the interconnections in the component based on data gathered during the monitoring process (step 602). The system uses the operational trend to estimate when the interconnections in the component will reach the LOS (step 604).

One embodiment of the present invention achieves two objectives: (1) providing early warning of the onset of degradation in interconnects, and (2) dynamically providing a shutdown criterion (i.e., LOS) based upon real-time analysis of the evolution of the degradation mechanism for the component. Hence, the present invention allows an end user to attain maximum utility from their assets for subtle and/or slowly evolving degradation modes, and to schedule quick service actions for more rapidly degrading mechanisms. This is in contrast with the present practice of suddenly experiencing catastrophic failure of interconnects without warning.

In one embodiment of the present invention, statistical analysis of the digitized time-series signals obtained from continuous system telemetry for interconnects provides information on initial state, intermittent behavior, degradation, and operational trends. The data obtained can be used to define the initial state of interconnects, such as resistance value at the beginning of operating life, to calculate distribution information for the noise associated with the signal (including, but not limited to, mean variance, skewness, and kurtosis), and to calculate derivatives of the monitored inferential variables.

In one embodiment of the present invention, specific interconnect locations are monitored using continuous system telemetry during normal operation. For example, the specific interconnect locations can be dedicated locations on ball grid array (BGA) solder balls, land grid array (LGA) sockets, dual in-line memory module (DIMM) pins, or surface mount contacts.

One embodiment of the present invention monitors the voltage, the resistance, and indicators of signal integrity of the interconnects during the normal operation of a component within a computer system. This embodiment uses the microprocessor within the computer system to perform evaluations of the interconnects.

SPRT (Sequential Probability Ratio Test)

The Sequential Probability Ratio Test is a statistical hypothesis test that differs from standard fixed sample tests. In fixed-sample statistical tests, a given number of observations are used to select one hypothesis from one or more alternative hypotheses. The SPRT, however, examines one observation at a time, and then makes a decision as soon as it has sufficient information to ensure that pre-specified confidence bounds are met.

The basic approach taken by the SPRT technique is to analyze successive observations of a discrete process. Let $y_n$ represent a sample from the process at a given moment $t_n$ in time. In one embodiment of the present invention, the sequence of values $\{Y_n\} = y_0, y_1, \ldots, y_n$ comes from a stationary process characterized by a Gaussian, white-noise probability density function (PDF) with mean 0. (Note that since with the sequence is from a nominally stationary processes, any process variables with a nonzero mean can be first normalized to a mean of zero with no loss of generality).

The SPRT is a binary hypothesis test that analyzes process observations sequentially to determine whether or not the signal is consistent with normal behavior. When a SPRT reaches a decision about current process behavior (i.e. the signal is behaving normally or abnormally), the system reports the decision and continues to process observations.

For each of the eight types of tandem SPRT tests described below, the signal data adheres to a Gaussian PDF with mean 0 and variance $\sigma^2$ for normal signal behavior, referred to as the null hypothesis, $H_0$. The system computes eight specific SPRT hypothesis tests in parallel for each inferential variable monitored. One embodiment of the present invention applies a SPRT to an electrical current time-series. Other embodiments of the present invention apply a SPRT to other inferential variables, including voltage, internal temperature, or stress variables.

The SPRT surveillance module executes all 8 tandem hypothesis tests in parallel. Each test determines whether the current sequence of process observations is consistent with the null hypothesis versus an alternative hypothesis. The first four tests are: (SPRT 1) the positive-mean test, (SPRT 2) the negative-mean test, (SPRT 3) the nominal-variance test, and (SPRT 4) the inverse-variance test. For the positive-mean test, the signal data for the corresponding alternative hypothesis, $H_1$, adheres to a Gaussian PDF with mean +M and variance $\sigma^2$. For the negative-mean test, the signal data for the corresponding alternative hypothesis, $H_2$, adheres to a Gaussian PDF with mean −M and variance $\sigma^2$. For the nominal-variance test, the signal data for the corresponding alternative hypothesis, $H_3$, adheres to a Gaussian PDF with mean 0 and variance $V\sigma^2$ (with scalar factor V). For the inverse-variance test, the signal data for the corresponding alternative hypothesis, $H_4$, adheres to a Gaussian PDF with mean 0 and variance $\sigma^2/V$.

The next two tandem SPRT tests are performed not on the raw inferential variables as above, but on the first difference function of the inferential variable. For discrete time series, the first difference function (i.e. difference between each observation and the observation preceding it) gives an estimate of the numerical derivative of the time series. During uninteresting time periods, the observations in the first difference function are a nominally stationary random process centered about zero. If an upward or downward trend suddenly appears in the signal, SPRTs number 5 and 6 observe an increase or decrease, respectively, in the slope of the inferential variable.

For example, if there is a decrease in the value of the inferential variable, SPRT alarms are triggered for SPRTs 2 and 6. SPRT 2 generates a warning because the sequence of raw observations drops with time. And SPRT 6 generates a warning because the slope of the inferential variable changes from zero to something less than zero. The advantage of monitoring the mean SPRT and slope SPRT in tandem is that the system correlates the SPRT readings from the eight tests and determines if the component has failed. For example, if the signal levels off to a new stationary value (or plateau), the alarms from SPRT 6 cease because the slope returns to zero when the raw signal reaches a plateau. However, SPRT 2 will continue generating a warning because the new mean value of the signal is different from the value prior to the degradation. Therefore, the system correctly identifies that the component has failed.

If SPRTs 3 or 4 generates a warning, the variance of the inferential variable is either increasing or decreasing, respectively. An increasing variance that is not accompanied by a change in mean (inferred from SPRTs 1 and 2 and SPRTs 5 and 6) signifies an episodic event that is "bursty" or "spiky" with time. A decreasing variance that is not accompanied by a change in mean is a common symptom of a failing component that is characterized by an increasing time constant. Therefore, having variance SPRTs available in parallel with slope and mean SPRTs provides a wealth of supplementary diagnostic information that has not been possible with conventional accelerated-life studies.

The final two tandem SPRT tests, SPRT 7 and SPRT 8, are performed on the first difference function of the variance estimates for the inferential variable. The first difference function of the variance estimates is a numerical approximation of the derivative of the sequence of variance estimates. As such, SPRT 7 triggers a warning flag if the variance of the inferential variable is increasing, while SPRT 8 triggers a warning flag if the variance of the inferential variable is decreasing. A comparison of SPRT alarms from SPRTs 3, 4, 7, and 8, gives a great deal of diagnostic information on a class of failure modes known collectively as a "change in gain without a change in mean." For example, if SPRTs 3 and 7 both trigger warning flags, it is an indication that there has been a sudden increase in the variance of the process. If SPRT 3 continues to trigger warning flags but SPRT 7 ceases issuing warning flags, it is an indication that the degradation mode responsible for the increased noisiness has gone to completion. Such information can be beneficial in root causing the origin of the degradation and eliminating it from future product designs.

Similarly, if SPRTs 4 and 8 both start triggering alarms, there is a decrease in variance for the process. If SPRT 4 continues to issue warning flags but SPRT 8 ceases issuing warning flags, it is an indication that the degradation mode has gone to completion. In safety-critical processes, this failure mode (decreasing variance without a change in mean) is dangerous in conventional systems that are monitored only by threshold limit tests. The reason it is dangerous is that a shrinking variance, when it occurs as a result of a transducer that is losing its ability to respond, never trips a threshold limit. (In contrast degradation that manifests as a linear decalibration bias, or even an increasing variance, eventually trips a high or low threshold limit and sounds a warning). A sustained decreasing variance, which happens, for example, when oil-filled pressure transmitters leak their oil, or electrolytic capacitors leak their electrolyte, never trips a threshold in conventional systems, but will be readily detected by the suite of 8 tandem SPRT tests taught in this invention.

The SPRT technique provides a quantitative framework that permits a decision to be made between the null hypothesis and the eight alternative hypotheses with specified misidentification probabilities. If the SPRT accepts one of the alternative hypotheses, an alarm flag is set and data is transmitted.

The SPRT operates as follows. At each time step in a calculation, the system calculates a test index and compares it to two stopping boundaries A and B (defined below). The test index is equal to the natural log of a likelihood ratio ($L_n$), which for a given SPRT is the ratio of the probability that the alternative hypothesis for the test ($H_j$, where j is the appropriate subscript for the SPRT in question) is true, to the probability that the null hypothesis ($H_0$) is true.

$$L_n = \frac{\text{probability of observed sequence} \{Y_n\} \text{ given } H_j \text{ is true}}{\text{probability of observed sequence} \{Y_n\} \text{ given } H_0 \text{ is true}} \quad (1)$$

If the logarithm of the likelihood ratio is greater than or equal to the logarithm of the upper threshold limit [i.e., $\ln(L_n) > \ln(B)$], then the alternative hypothesis is true. If the logarithm of the likelihood ratio is less than or equal to the logarithm of the lower threshold limit [i.e., $\ln(L_n) < \ln(A)$], then the null hypothesis is true. If the log likelihood ratio falls between the two limits, [i.e., $\ln(A) < \ln(L_n) < \ln(B)$], then there is not enough information to make a decision (and, incidentally, no other statistical test could yet reach a decision with the same given Type I and II misidentification probabilities).

Equation (2) relates the threshold limits to the misidentification probabilities $\alpha$ and $\beta$:

$$A = \frac{\beta}{1-\alpha}, \quad (2)$$
$$B = \frac{1-\beta}{\alpha}$$

where $\alpha$ is the probability of accepting $H_j$ when $H_0$ is true (i.e., the false-alarm probability), and $\beta$ is the probability of accepting $H_0$ when $H_j$ is true (i.e., the missed-alarm probability).

The first two SPRT tests for normal distributions examine the mean of the process observations. If the distribution of observations exhibits a non-zero mean (e.g., a mean of either $+M$ or $-M$, where M is the pre-assigned system disturbance magnitude for the mean test), the mean tests determine that the system is degraded. Assuming that the sequence $\{Y_n\}$ adheres to a Gaussian PDF, then the probability that the null hypothesis $H_0$ is true (i.e., mean 0 and variance $\sigma^2$) is:

$$P(y_1, y_2, \ldots, y_n | H_0) = \frac{1}{(2\pi\sigma^2)^{n/2}} \exp\left[-\frac{1}{2\sigma^2} \sum_{k=1}^{n} y_k^2\right] \quad (3)$$

Similarly, the probability for alternative hypothesis $H_1$ is true (i.e. mean M and variance $\sigma^2$) is $$P(y_1, y_2, \ldots, y_n | H_1) = \quad (4)$$

$$\frac{1}{(2\pi\sigma^2)^{n/2}} \exp\left[-\frac{1}{2\sigma^2}\left(\sum_{k=1}^{n} y_k^2 - 2\sum_{k=1}^{n} y_k M + \sum_{k=1}^{n} M^2\right)\right]$$

The ratio of the probabilities in (3) and (4) gives the likelihood ratio $L_n$ for the positive-mean test:

$$L_n = \exp\left[-\frac{1}{2\sigma^2} \sum_{k=1}^{n} M(M - 2y_k)\right] \quad (5)$$

Taking the logarithm of likelihood ratio given by (5) produces the SPRT index for the positive-mean test ($SPRT_{pos}$):

$$SPRT_{pos} = -\frac{1}{2\sigma^2} \sum_{k=1}^{n} M(M - 2y_k) = \frac{M}{\sigma^2} \sum_{k=1}^{n} \left(y_k - \frac{M}{2}\right) \quad (6)$$

The SPRT index for the negative-mean test ($SPRT_{neg}$) is derived by substituting $-M$ for each instance of M in (4) through (6) above, resulting in:

$$SPRT_{neg} = \frac{M}{\sigma^2} \sum_{k=1}^{n} \left(-y_k - \frac{M}{2}\right) \quad (7)$$

The remaining two SPRT tests examine the variance of the sequence. This capability gives the SPRT module the ability to detect and quantitatively characterize changes in variability for processes, which is vitally important for 6-sigma QA/QC improvement initiatives. In the variance tests, the system is degraded if the sequence exhibits a change in variance by a factor of V or 1/V, where V, the pre-assigned system disturbance magnitude for the variance test, is a positive scalar. The probability that the alternative hypothesis $H_3$ is true (i.e., mean 0 and variance $V\sigma^2$) is given by (3) with $\sigma^2$ replaced by $V\sigma^2$:

$$P(y_1, y_2, \ldots, y_n | H_0) = \frac{1}{(2\pi V\sigma^2)^{n/2}} \exp\left[-\frac{1}{2V\sigma^2} \sum_{k=1}^{n} y_k^2\right] \quad (8)$$

The likelihood ratio for the variance test is given by the ratio of (8) to (3):

$$L_n = V^{-n/2} \exp\left[-\frac{1}{2\sigma^2} \frac{1-V}{V} \sum_{k=1}^{n} y_k^2\right] \quad (9)$$

Taking the logarithm of the likelihood ratio given in (9) produces the SPRT index for the nominal-variance test ($SPRT_{nom}$):

$$SPRT_{nom} = \frac{1}{2\sigma^2}\left(\frac{V-1}{V}\right)\sum_{k=1}^{n} y_k^2 - \frac{n}{2}\ln V \quad (10)$$

The SPRT index for the inverse-variance test ($SPRT_{inv}$) is derived by substituting 1/V for each instance of V in (8) through (10), resulting in:

$$SPRT_{inv} = \frac{1}{2\sigma^2}(1-V)\sum_{k=1}^{n} y_k^2 + \frac{n}{2}\ln V \quad (11)$$

The tandem SPRT module performs mean, variance, and SPRT tests on the raw process signal and on its first difference function. To initialize the module for analysis of an inferential variable time-series, the user specifies the system disturbance magnitudes for the tests (M and V), the false-alarm probability ($\alpha$), and the missed-alarm probability ($\beta$).

Then, during the training phase (before the first failure of a component under test), the module calculates the mean and variance of the monitored variable process signal. For most inferential variables the mean of the raw observations for the inferential variable will be nonzero; in this case the mean calculated from the training phase is used to normalize the signal during the monitoring phase. The system disturbance magnitude for the mean tests specifies the number of standard deviations (or fractions thereof) that the distribution must shift in the positive or negative direction to trigger an alarm. The system disturbance magnitude for the variance tests specifies the fractional change of the variance necessary to trigger an alarm.

At the beginning of the monitoring phase, the system sets all eight SPRT indices to 0. Then, during each time step of the calculation, the system updates the SPRT indices using (6), (7), (10), and (11). The system compares each SPRT index is then compared to the upper [i.e., $\ln((1-\beta)/\alpha]$ and lower [i.e., $\ln((\beta/(1-\alpha))]$ decision boundaries, with these three possible outcomes:

1. the lower limit is reached, in which case the process is declared healthy, the test statistic is reset to zero, and sampling continues;

2. the upper limit is reached, in which case the process is declared degraded, an alarm flag is raised indicating a sensor or process fault, the test statistic is reset to zero, and sampling continues; or 3. neither limit has been reached, in which case no decision concerning the process can yet be made, and the sampling continues.

The advantages of using a SPRT are twofold:

1. early detection of very subtle anomalies in noisy process variables; and 2. pre-specification of quantitative false-alarm and missed-alarm probabilities.

The present invention uses tandem SPRTs to monitor "derivative SPRTs" in parallel with mean and variance SPRTs that are performed on the time-series associated an inferential variable in the context of accelerated-life studies, where it is not possible to perform direct functional tests in real-time. The new tandem-SPRT approach facilitates determining the onset of hardware degradation for components under test as well as the exact time of failure (within the resolution of the time samples for the inferential variable). Moreover, the onset of "spiky" degradation in components as well as degradation in the sensor that is used to measure the inferential variable can be deduced. Information from the suite of eight tandem SPRTs provides a substantially complete and substantially accurate picture of the dynamic reliability of the components.

Detecting the Onset of Hardware Degradation

Figure 7:
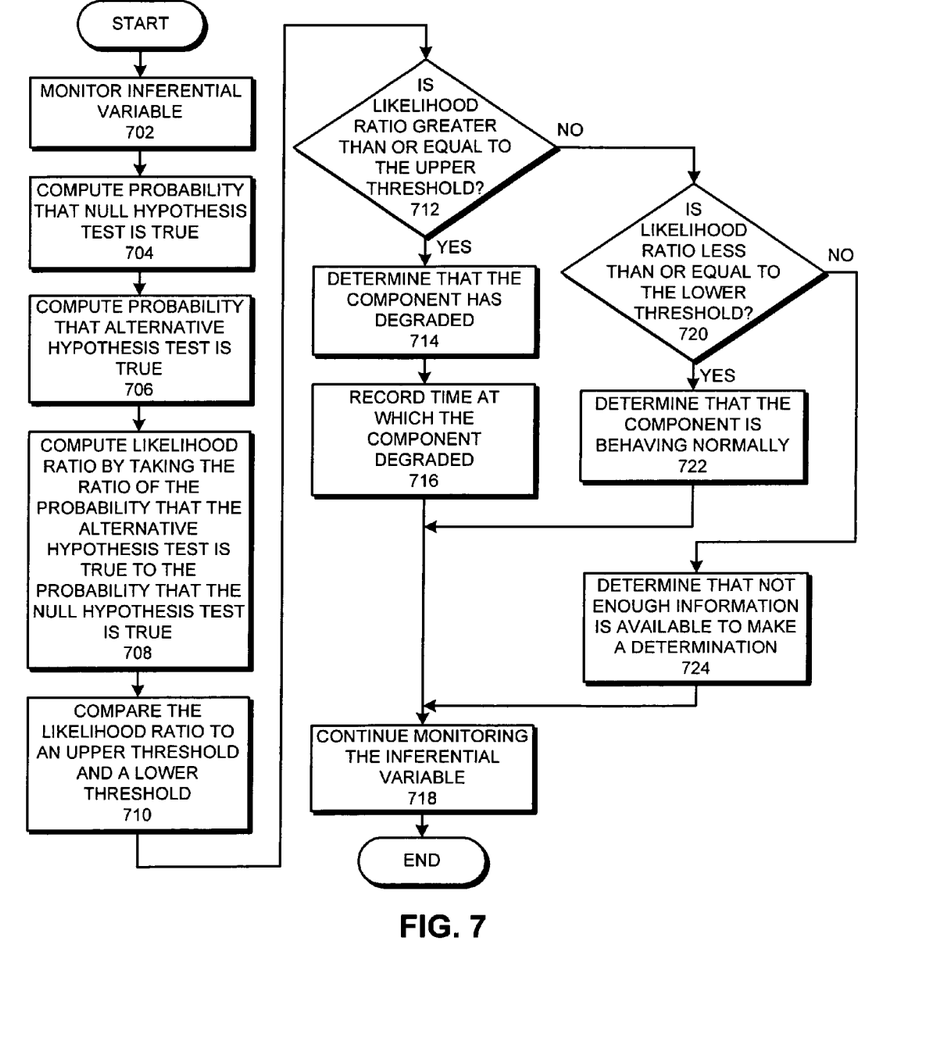
FIG. 7 presents a flow chart illustrating the process of detecting the onset of hardware degradation for components during operation in accordance with an embodiment of the present invention.

FIG. 7 presents a flow chart illustrating the process of detecting the onset of hardware degradation for components during operation in accordance with an embodiment of the present invention.

During operation, the system monitors an inferential variable (step 702).

Next, the system computes a probability that the null hypothesis test is true (step 704) and computes the probability that an alternative hypothesis test is true (step 706). Recall that the null hypothesis is true if the specimen of the component is behaving normally and has not degraded. Conversely, the alternative hypothesis is true if the specimen of the component has degraded.

The system then computes a likelihood ratio by taking the ratio of the probability that the alternative hypothesis test is true to the probability that the null hypothesis tests is true (step 708).

Next, the system compares the likelihood ratio to an upper threshold and a lower threshold (step 710). Note that these thresholds allow the user to tune the sensitivity of the process while detecting abnormal behavior of an inferential variable.

If the likelihood ratio is greater than or equal to the upper threshold (step 712), the system determines that the component has degraded (step 714) and records the time at which the component has degraded (step 716). The system then continues monitoring the inferential variable (step 718).

On the other hand, if the likelihood ratio is less than or equal to the lower threshold (step 720), the system determines that the inferential variable is observing background variations (step 722) and continues monitoring the inferential variable (step 718).

Finally, if the likelihood ratio is between the lower and the upper thresholds, the system determines that not enough information is available (step 724) and continues monitoring the inferential variable (step 618).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for detecting the onset of degradation for interconnections in a component within a computer system, comprising:

monitoring inferential variables associated with the interconnections within the computer system during operation of the computer system, wherein the inferential variables can include one or more of:
  voltage;
  current;
  resistance;
  capacitance;
  inductance;
  a signal-to-noise ratio;
  a bit-error rate;
  the number of times an operation in the component is retried; and
  the size of an eye-diagram opening;
determining a present state of the component from the monitored inferential variables;
comparing the present state of the component with an initial state of the component; and
if the comparison indicates that the interconnections in the component have reached or will reach a limited operating state (LOS), performing a remedial action.

2. The method of claim 1, wherein performing the remedial action involves servicing or replacing the component.

3. The method of claim 1, wherein determining if the interconnections in the component have reached or will reach the LOS involves:
  determining an operational trend for the state of the component based on data gathered during the monitoring process; and
  using the operational trend to estimate when the interconnections in the component will reach the LOS.

4. The method of claim 1, wherein prior to monitoring the inferential variables, the method further comprises determining the initial state of component system by:
  monitoring the inferential variables during an initial period of normal operation; and
  determining the initial state from the monitored inferential variables.

5. The method of claim 1, wherein the LOS is a state wherein the amount of degradation that has occurred since the initial state makes further operation of the component unacceptable.

6. The method of claim 5, further comprising calculating a remaining life for the component by:
  calculating an amount of degradation which has occurred in the interconnections in the component since the initial state; and
  normalizing the amount of degradation to a range between the initial state and the LOS to generate an estimate for the remaining life of the component.

7. The method of claim 5, further comprising calculating a remaining life for the component by using a model of a degradation mechanism for the interconnections.

8. The method of claim 1, wherein a state of an inferential variable can include:
  a present value of the inferential variable;
  a mean of the inferential variable;
  a variance of the inferential variable;
  a skewness of the inferential variable;
  a kurtosis of the inferential variable; and
  a derivative of the inferential variable.

9. A computer-readable storage medium storing instructions that when executed by a computer cause the computer to perform a method for detecting the onset of degradation for interconnections in a component within a computer system, wherein the method comprises:
monitoring inferential variables associated with the interconnections within the computer system during operation of the computer system, wherein the inferential variables can include one or more of:
  voltage;
  current;
  resistance;
  capacitance;
  inductance;
  a signal-to-noise ratio;
  a bit-error rate;
  the number of times an operation in the component is retried; and
  the size of an eve-diagram opening;
determining a present state of the component from the monitored inferential variables;
comparing the present state of the component with an initial state of the component; and
if the comparison indicates that the interconnections in the component have reached or will reach a limited operating state (LOS), performing a remedial action.

10. The computer-readable storage medium of claim 9, wherein performing the remedial action involves servicing or replacing the component.

11. The computer-readable storage medium of claim 9, wherein determining if the interconnections in the component have reached or will reach the LOS involves:
  determining an operational trend for the state of the component based on data gathered during the monitoring process; and
  using the operational trend to estimate when the interconnections in the component will reach the LOS.

12. The computer-readable storage medium of claim 9, wherein prior to monitoring the inferential variables, the method further comprises determining the initial state of the component by:
  monitoring the inferential variables during an initial period of normal operation; and
  determining the initial state from the monitored inferential variables.

13. The computer-readable storage medium of claim 9, wherein the LOS is a state wherein the amount of degradation that has occurred since the initial state makes further operation of the component unacceptable.

14. The computer-readable storage medium of claim 13, wherein the method further comprises calculating a remaining life for the component by:
  calculating an amount of degradation which has occurred in the interconnections in the component since the initial state; and
  normalizing the amount of degradation to a range between the initial state and the LOS to generate an estimate for the remaining life of the component.

15. The computer-readable storage medium of claim 13, wherein the method further comprises calculating a remaining life for the component by using a model of a degradation mechanism for the interconnections.

16. The computer-readable storage medium of claim 9, wherein a state of an inferential variable can include:
  a present value of the inferential variable;
  a mean of the inferential variable;
  a variance of the inferential variable;
  a skewness of the inferential variable;
  a kurtosis of the inferential variable; and
  a derivative of the inferential variable.

17. An apparatus that detects the onset of degradation for interconnections in a component within a computer system, comprising:
a monitoring mechanism configured to monitor inferential variables associated with the interconnections within the computer system during operation of the computer system, wherein the inferential variables can include one or more of:
voltage;
current;
resistance;
capacitance;
inductance;
a signal-to-noise ratio;
a bit-error rate;
the number of times an operation in the component is retried; and
the size of an eye-diagram opening;
a degradation-detection mechanism configured to:
determine a present state of the component from the monitored inferential variables;
compare the present state of the component with an initial state of the component; and
if the comparison indicates that the interconnections in the component have reached or will reach a limited operating state (LOS), to perform a remedial action.

18. The apparatus of claim 17, further comprising a service mechanism wherein while performing the remedial action, the service mechanism is configured to service or to replace the component.

* * * * *

UNITED STATES PATENT AND TRADEMARK OFFICE
CERTIFICATE OF CORRECTION

| | | |
|---|---|---|
| PATENT NO. | : 7,353,431 B2 | Page 1 of 1 |
| APPLICATION NO. | : 11/508025 | |
| DATED | : April 1, 2008 | |
| INVENTOR(S) | : Leoncio D. Lopez et al. | |

It is certified that error appears in the above-identified patent and that said Letters Patent is hereby corrected as shown below:

In claim 9 (at column 14, line 14), please delete the words, "eve-diagram" and replace it with the words --eye-diagram--.

In claim 17 (at column 16, line 1), please delete the words, "eve-diagram" and replace it with the words --eye-diagram--.

Signed and Sealed this

Eighth Day of July, 2008

JON W. DUDAS
*Director of the United States Patent and Trademark Office*